United States Patent [19]

Covington et al.

[11] Patent Number: 5,173,390
[45] Date of Patent: * Dec. 22, 1992

[54] WATER SOLUBLE CONTRAST ENHANCEMENT COMPOSITION AND METHOD OF USE

[75] Inventors: John B. Covington, Richardson; Vic B. Marriott, Dallas; Larry G. Venable, Grand Prairie; Peter Kim, Carrollton, all of Tex.

[73] Assignee: Texas Instruments Incorporated, Dallas, Tex.

[ * ] Notice: The portion of the term of this patent subsequent to Mar. 5, 2008 has been disclaimed.

[21] Appl. No.: 542,471

[22] Filed: Sep. 13, 1990

Related U.S. Application Data

[62] Division of Ser. No. 267,151, Dec. 9, 1988, Pat. No. 4,997,742, which is a division of Ser. No. 879,653, Jun. 27, 1986, Pat. No. 4,816,380.

[51] Int. Cl.$^5$ .................... G03C 1/54; G03C 1/60; G03F 7/022; G03F 7/023
[52] U.S. Cl. .................... 430/192; 430/193; 430/311; 430/326
[58] Field of Search ............... 430/191, 192, 193, 311, 430/28, 145, 156, 175, 176, 312, 325, 326, 329

[56] References Cited

U.S. PATENT DOCUMENTS

| | | | |
|---|---|---|---|
| 3,269,837 | 9/1966 | Sus | 430/193 |
| 3,890,152 | 6/1975 | Ruckert | 430/175 |
| 3,965,278 | 6/1976 | Duinker | 430/28 |
| 4,672,021 | 6/1987 | Blumel | 430/175 |
| 4,997,742 | 3/1991 | Covington | 430/192 |

FOREIGN PATENT DOCUMENTS 1294105 10/1972 United Kingdom ............... 430/145

Primary Examiner—Marion E. McCamish
Assistant Examiner—Kathleen Duda
Attorney, Agent, or Firm—Richard A. Stoltz; Richard L. Donaldson; Jay Cantor

[57] ABSTRACT

A water soluble contrast enhancement compound and composition, and a method of use thereof, are disclosed for improving sidewall profiles in photoresist patterning and developing. The compound consists of a 1-oxy-2-diazonaphthalene sulfonamide salt.

9 Claims, 1 Drawing Sheet

WATER SOLUBLE CONTRAST ENHANCEMENT COMPOSITION AND METHOD OF USE

This is a division of application Ser. No. 267,151, filed Dec. 9, 1988 (now U.S. Pat. No. 4,997,742), which was a division of Ser. No. 879,653, filed Jun. 27, 1986 (now U.S. Pat. No. 4,816,380).

TECHNICAL FIELD OF THE INVENTION

This invention relates in general to processes for the manufacture of semiconductor chips and more particularly relates to photoresists and their method of use.

BACKGROUND OF THE INVENTION

In conventional semiconductor chip manufacturing techniques, photoresist is routinely used to define areas in the wafer surface that are to be etched or into which dopants are to be diffused.

According to conventional processes, a layer of photoresist is deposited on top of the semiconductor chip layer to be worked. Next, selected portions of the layer of photoresist are exposed to a light source containing a preselected wavelength. The exposed portions of the photoresist become soluble in a developer compound, while the unexposed portions remain insoluble. The developer compound is next used to strip away or "develop" the photoresist, thus defining areas in the chip surface for diffusion or plasma etching.

Although contact printing processes are known, the photoresist layer is often used with a projection printing process. According to this printing process, an opaque projection mask is first printed on a transparent plate to define the areas of the photoresist which are to be exposed. Ultraviolet light containing the selected wavelength is transmitted through the projection mask and an image reduction lens of appropriate power and is then projected on the photoresist layer.

As the critical dimensions of the imaged features of integrated circuits have grown smaller and smaller, diffraction around the edges of the features has grown more and more pronounced. The resultant diffraction patterns degrade imaging in that they produce photoresist-defined areas having wider dimensions and sidewalls with undesirable slopes.

This diffraction problem has conventionally been solved with a contrast enhancement layer placed on top of the photoresist layer. The contrast enhancement layer is initially opaque, but becomes transparent upon exposure to the same light that develops the photoresist. On the deposition of a sufficiently thick contrast enhancement layer, only the intended area of the photoresist will be exposed. Substantially perpendicular photoresist sidewalls result, which means that the size of an etched feature plasma etched thereafter can be more strictly dimensioned.

Conventional contrast enhancement compounds have a serious drawback in that they are not water-soluble. Typically, these compounds must be coated onto the photoresist with the aid of an organic solvent. Conventional photoresists are however also somewhat soluble in this organic solvent, and thus the contrast enhancement layer coating process may endanger the integrity of the underlying photoresist. The exposure time of the photoresist to the organic solvent must therefore be closely watched.

After the photoresist layer has been exposed, it is necessary to strip off the conventional contrast enhancement compound with further organic solvent, which will then again tend to attack the photoresist. Not only does the use of an organic solvent pose a problem in preserving the integrity of the underlying photoresist, it also introduces further steps, time and expense in the manufacturing process. Finally, the conventional contrast enhancement compound has been found to be thermally unstable and to have a poor shelf life.

A need has therefore arisen in the industry for a contrast enhancement composition that does not require an organic solvent, that simplifies the patterning process, and that has longer shelf life than previously known enhancement compositions.

SUMMARY OF THE INVENTION

The present invention discloses a water-soluble contrast enhancement composition which has improved shelf life and which reduces the number of steps necessary to employ a photoresist layer in a semiconductor chip manufacturing process. The composition comprises a photosensitive contrast enhancement compound soluble in water, preferably a 1-oxy-2-diazonaphthalene sulfonamide salt. The amido group of the compound may be secondary, tertiary or quaternary, although it is preferred that it be quaternary. The salt may be made by the association of the amido group with any water-solubilizing anion compatible with the system, such as chloride. The 1-oxy-2-diazonaphthalene radical of the compound may have the sulfonamide group attached at any of positions 3-8, although attachment of the sulfonamide salt at positions 4 or 5 is preferred, and most preferably a 1-oxy-2-diazonaphthalene 5-sulfonamide salt is employed.

The water soluble contrast enhancement composition is formulated by putting from 1.67% to 16.6% by weight of the aforementioned compound into an aqueous solution with from 4.3% to 8.8% of a binder such as polyvinyl alcohol. This formulation is coated on top of the photoresist layer, dried, exposed during the exposure of the photoresist, and is stripped off with an aqueous medium, preferably in the same step as the aqueous pretreatment of the exposed photoresist layer. Since the composition of the invention is water-soluble, it has the advantages of avoiding the use of an organic solvent and thus preserves the integrity of the photoresist layer. Since an organic solvent need no longer be employed, the steps in the photoresist patterning process are reduced and the cost of the solvent is avoided. Finally, it has been found that the composition of the invention has an improved shelf life over conventional contrast enhancement compositions.

BRIEF DESCRIPTION OF THE DRAWINGS

For a more complete understanding of the invention, reference is now made to the following detailed description taking in conjunction with the drawings, in which.

DETAILED DESCRIPTION OF THE DRAWINGS

Figure 1:
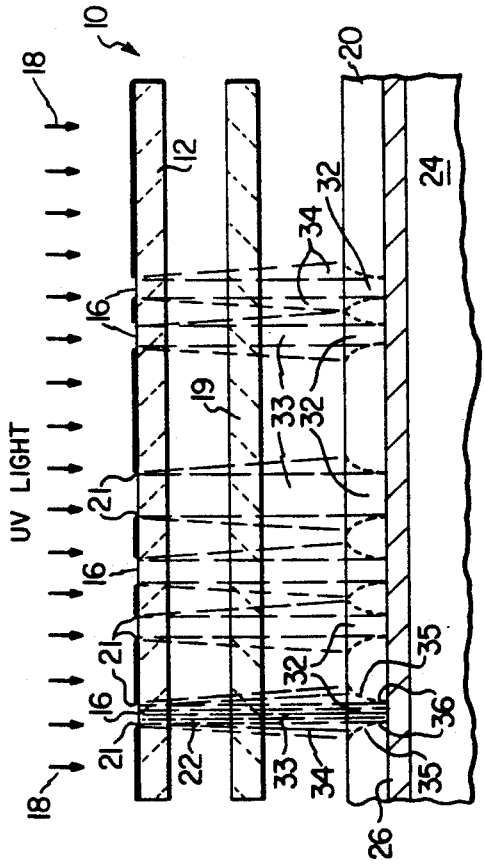
FIG. 1 is a somewhat schematic sectional view of a conventional projection photoresist patterning process performed without a contrast enhancement layer.

Referring now to the drawings, FIG. 1 is a schematic sectional diagram showing a photoresist exposure step according to the prior art. A projection mask 10 comprises a transparent quartz plate 12 with an opaque, conventionally metallic pattern 14 printed thereon. Pattern 14 has a plurality of openings or features 16 that allow the transmission of developing light. The developing light, which conventionally is from an ultraviolet light source, is shown schematically by arrows 18. Light 18 contains a wavelength, such as 3650 Angstroms or 4360 Angstroms, that will chemically alter the photoresist.

Projection mask 12 may be 1×, 5×, 10× or of another magnification. In the case of a 10× mask, each opening 16 is ten times the dimension of the area on the photoresist which is to be exposed. After the light passes through the openings 16 in mask 10, it is focused by a reduction lens 19 of suitable power into a photoresist layer 20.

Each opening 16 is surrounded by an edge 21. According to well-known principles of diffraction, light 18 will tend to bend around edges 21 to form a diffraction pattern 22. The smaller the opening 16, the more pronounced the diffraction pattern 22 becomes. Since integrated circuit sizes are getting smaller and smaller and therefore areas 16 are shrinking, such diffraction is becoming an increasingly important limiting factor.

Projection mask 10 is held a predetermined distance away from a substrate 24. Substrate 24 includes a layer 26 that is to be processed by either plasma etching or diffusion. Substrate 24 can comprise semiconductor or insulator material, and layer 26 can comprise any material which is used in the fabrication of semiconductor devices. For example, layer 26 can comprise silicon, polysilicon or even metal.

Before this point in the process, a positive photoresist layer 20 is deposited on the surface of layer 26. In its undeveloped condition, photoresist layer 20 is insoluble in a basic developer solution.

The exposure of photoresist layer 20 by diffraction patterns 22 causes regions 32 of layer 20 to change their chemical structure. Photoresist layer 20 conventionally comprises a coating of novolak resin that is usually soluble in a basic aqueous solution. Layer 20 also has an amount of a photosensitive "dissolution inhibitor" that prevents the base from dissolving the novolak resin. This dissolution inhibitor is conventionally a 1-oxy-2-diazonaphthalene that changes upon exposure to water and ultraviolet light to a 1-indenecarboxylic acid. Since 1-indenecarboxylic acid is soluble in a base and no longer inhibits dissolution of the resin, it and the resin may thus be washed away in a base developing solution.

Diffraction patterns 22 cause the chemically altered regions 32 to be wedge-shaped as shown. Each diffraction pattern 22 has a relatively intense center portion 33 that corresponds to the pattern desired, and a much weaker diffractive peripheral portion 34. The light of center portion 33 is intense enough to chemically alter the photoresist layer 20 all the way down to layer 26. The intensity of peripheral region 34 decreases roughly asymptotically as a function of the distance from the central portion 33. Since the intensity of the light decreases, an increasingly shallow amount of the photoresist material will change its chemical structure. This produces the wedge-shaped chemically altered regions 32 as shown.

After regions 32 are washed away by a basic developer solution, wedge-shaped sidewalls 35 are exposed. Sidewalls 35 form an angle of approximately 75° to layer 26, and thereby define wedge-shaped regions 36 in the corner of sidewall 35 and the top surface of layer 26. The small depth of regions 36 makes them susceptible to destruction by a subsequent plasma etch process. This in turn causes a larger than planned feature in layer 26 to be etched.

Figure 2B:
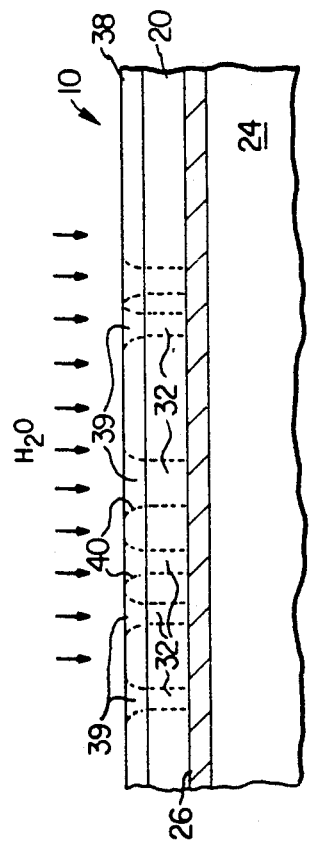
FIGS. 2a-2d are like sectional views of sequential stages of a photoresist patterning process according to the invention.
Figure 2C:
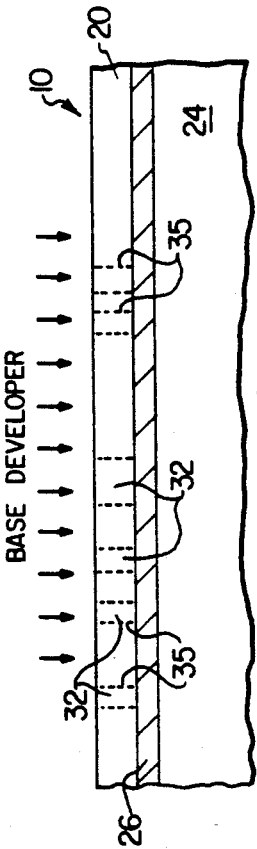
Figure 2D:
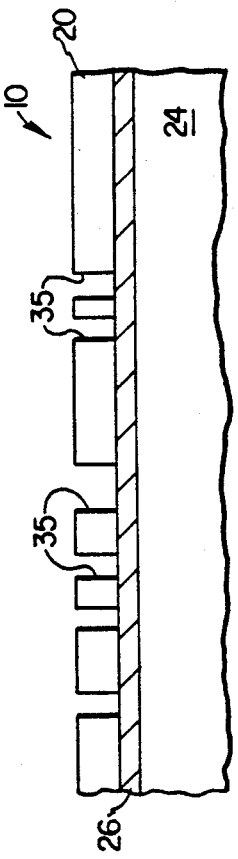
Figure 2A:
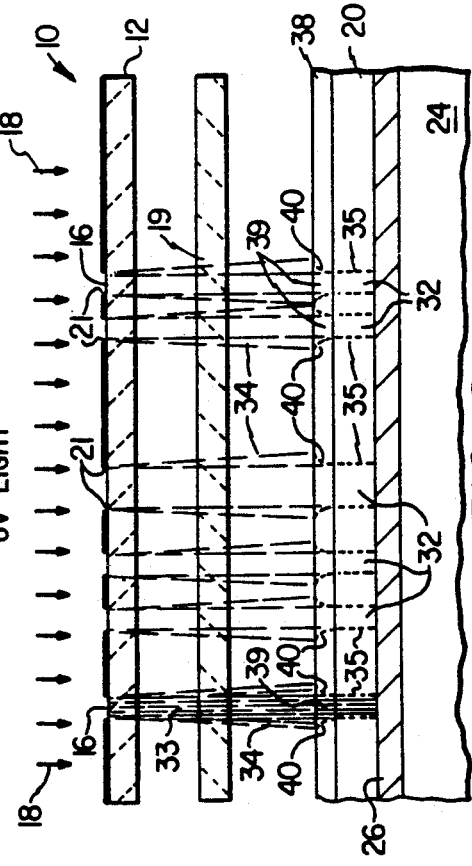

Referring now to FIG. 2a, a photoresist exposure step according to the present invention is illustrated. The step is similar to that illustrated in FIG. 1, except that a contrast enhancement layer 38 according to the present invention has been deposited on the surface of photoresist layer 20. Contrast enhancement layer 38 is opaque in an unexposed condition, but turns transparent when exposed to the developing light. Where the underlying photoresist layer 20 is photosensitive to one or more wavelengths of ultraviolet light, the photosensitive compound in the contrast enhancement layer 38 is selected to likewise be sensitive to these wavelengths.

As shown, the central portion 33 of diffraction pattern 22 turns enhancement layer 38 transparent completely through its depth and goes on to chemically alter region 32 of photoresist layer 20. However, the peripheral portion 34 of diffraction pattern 22 will not completely penetrate contrast enhancement layer 38. Peripheral portion 34 will turn only a portion of that area of layer 38 on which it impinges from opaque to transparent. The boundary between opaque and transparent material will roughly follow dotted line 40.

The thickness of contrast enhancement layer 38, as well as the concentration of photosensitive material within it, are selected according to the intensity of and duration of exposure to ultraviolet light source 18. These parameters are selected such that the sloping of sidewalls 34 due to diffraction is minimized. Where the sidewalls form substantially 90° angles with the layer 26, the contrast of the developed photoresist will be enhanced over developed photoresist having sloping sidewalls.

Up to this point in the described patterning process, the use of contrast enhancement layer 38 is as per conventional contrast enhancement techniques. However, as noted, a principal disadvantage of the conventional contrast enhancement compound is that contrast enhancement layer 38 must be coated onto photoresist layer 20 using a certain organic solvent, and must also be stripped away therefrom using this organic solvent. Conventional photoresist formulations, which are principally composed of novolak resin with a photosensitive additive, are at least slightly soluble in this organic solvent. Extreme care must therefore be exercised so that the integrity of the photoresist layer 20 is not damaged during the deposit or removal of contrast enhancement layer 38. In particular, the time for which the organic solvent contacts the wafer surface must be strictly controlled.

A principal advantage of the invention is its provision of a water-soluble contrast enhancement layer 38. Contrast enhancement layer 38 therefore may be coated onto layer 26 as an aqueous solution, and later removed with an aqueous medium. Since photoresist layer 20 is not water soluble at a neutral pH, it remains completely intact. Further, the use of an organic solvent in a separate contrast enhancement layer removal step is avoided.

The formulation of the contrast enhancement composition of the invention will be described in more detail below. The composition is spin-coated onto photoresist layer 20 in an aqueous solution. Layer 38 is then baked until dried, for a time based on the heating method used.

Since the photosensitive compound in enhancement layer 38 breaks down above 110° C., this temperature should not be exceeded, and more preferably should be about 95° C. Where a hotplate is used to bake on layer 38, the baking duration is approximately 15 to 45 seconds, and is preferably about 60 seconds; where an oven is used, the baking time is approximately 15 minutes.

The thickness of contrast enhancement layer 38 may vary from 1,000 to 3,500 Angstroms. The thickness should normally not be much less than 1,000 Angstroms, as its effectiveness in stopping the peripheral portion of diffraction pattern 22 would start to decrease and may no longer completely cover photoresist layer 20. On the other hand, the layer should not generally be much thicker than 3,500 Angstroms, as thicknesses above this may not become transparent all the way to photoresist layer for conventionally used exposure times and the coating may begin to lose its uniformity in thickness. A thickness that works best for many applications is about 1500 Angstroms. The thickness will vary according to the concentrations of the composition constituents in the aqueous solution used, and will also vary according to how fast the wafer is spun while the coating is applied. In general, the lower the spin rate, the thicker is the coating 38. Spin rates may range between 1000 and 8000 RPM, and more typically are between 2000 and 4000 RPM.

After contrast enhancement layer 38 is coated and dried, photoresist layer 20 and contrast enhancement layer 38 are ready to be exposed to ultraviolet light. In patterning processes that do not use a contrast enhancement layer, the exposure time is usually about 80 milliseconds. This exposure time is increased from 15 to 40 percent in order to allow the central portion 33 of diffraction pattern 22 to completely react a corresponding region of contrast enhancement layer 38 as well as an underlying photoresist region 32. The exposure time is preferably increased to around 100 milliseconds. The thickness of contrast enhancement layer 38 should vary as a function of the concentration of photosensitive material within it and the intensity of the light source.

After exposure, the boundaries of the chemically altered photoresist regions 32 and overlaying transparent regions 39 are shown by sidewalls 35 and boundaries 40. As can be seen, the use of the contrast enhancement layer produces much straighter sidewalls 35, which approach 90 degrees with respect to the surface of layer 26.

Referring now to FIG. 2b, the wafer section shown in FIG. 2a is shown undergoing a first step of a photoresist development process of the invention. As shown, water or another aqueous medium is applied to the surface of contrast enhancement layer 38. Since the contrast enhancement layer 38 of the invention is water soluble, the applied water removes the layer 38. The application of water does not however represent an additional step in the process, as water is conventionally applied to photoresist layer 20 in order to make it more hydrophilic. If a water rinse step is not used, contrast enhancement layer 38 can be removed by the basic aqueous solution used in the photoresist development step as next described.

Referring to FIG. 2c, the next step in the development process is shown. Photoresist layer 20 is now exposed. A base developer having a pH greater than 7 is applied to the photoresist layer 20 in order to remove regions 32. The photoresist layer as finally developed is shown in FIG. 2d.

A preferred composition for water-soluble contrast enhancement layer 38 includes as its photosensitive component a 1-oxy-2-diazonaphthalene sulfonamide salt. A preferred form is set out below:

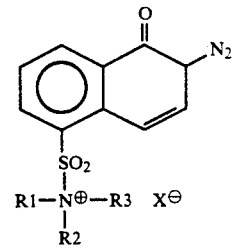

The structure illustrated is a 1-oxy-2-diazonaphthalene 5-sulfonamide halide. The sulfonamide group can also be attached at positions 3, 4, 6, 7 or 8, so long as its absorption spectrum does not shift appreciably. R1, R2 and R3 may be hydro, or alkyl groups ranging in carbon number from $C_1$ through at least $C_4$. Although secondary and tertiary amido groups have been shown to perform adequately, it is preferred that the amido group be quaternary, that is, R1 through R3 all be alkyl groups. R1, R2 and R3 need not be the same. A triethylamido group has been found to be particularly efficacious in creating the desired solubility of the compound in water.

In order to create water solubility, the illustrated sulfonamide compound is associated with a solubilizing anion $X^-$. Chloride or other halide is preferred, but the anion can also be $(SbF_6)^-$, tetraphenylbromo, hydroxy or any other anion compatible with the system.

The illustrated compound is opaque unless it is exposed to ultraviolet light, for instance, 3650 angstroms or 4360 angstroms. When exposed to ultraviolet light at between or near these wavelengths the diazo and oxy groups of the compound react to create an intermediate carbene, which in turn reacts with water present in the environment to produce a 1-indene-carboxylic acid. This product of the photoreaction is transparent, but is still water soluble as well as being soluble in a base solution. The photochemical reaction is set out below.

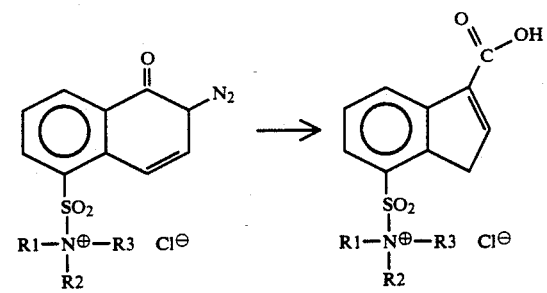

One advantage of the invention's compound is that, unlike the conventional contrast enhancement compositions, it is sensitive to more than one ultraviolet wavelength. The conventional compositions are specific to a particular ultraviolet wavelength or a tight band of wavelengths. One conventional composition is sold for use with the I emission line (3650 Angstroms) of conventional mercury-arc ultraviolet lamps; another is sold for use with the G line (4360 Angstroms) of such lamps. The compound of the invention performs well in connection with either wavelength, or any wavelength in between. It can be used with light sources having wavelengths ranging from 3400 Angstroms through 4360 Angstroms, and has an absorption maximum at 4050 Angstroms.

The compound of the invention may be synthesized as follows.

A first reagent is selected from the group consisting of sulfonyl halides of a 1-oxy-2-diazonaphthalene. This first reagent is sometimes known in the industry as a "diazoquinone" sulfonyl halide, although a diazoquinone has a different chemical formula according to IUPAC (International Union of Pure and Applied Chemistry) terminology. The first reagent is known as a 1-oxy-2-diazonaphthalene sulfonyl halide according to IUPAC nomenclature, which is used throughout the specification and claims. The compound 1-oxy-2-diazonaphthalene 5-sulfonyl chloride is preferred, as it is available in commercial quantities. This is reacted with an amine, preferably a tertiary amine for maximum water solubility. A particularly preferred second reagent is triethylamine.

The 1-oxy-2-diazonaphthalene sulfonyl chloride is dissolved in a solution of tetrahydrofuran or other solvent that will not react with the sulfonyl chloride. This solution is cooled, and the selected amine is added slowly. As produced in the laboratory, the amine is added dropwise, as the reaction is exothermic. The tetrahydrofuran is then evaporated, and the resultant sulfonamide chloride is dried under a vacuum. To formulate an aqueous coating solution to produce contrast enhancement layer 38, between 1.67 and 16.6 weight percent of the sulfonamide chloride is dissolved in an aqueous solution with between 4.3 and 8.8 weight percent of polyvinyl alcohol. The polyvinyl alcohol is used as a binder in the resultant coating. More preferred ranges are 1.67% to 8.7% by weight of the sulfonamide chloride and 4.3% to 4.7% of the polyvinyl alcohol.

As the concentration of the sulfonamide chloride and polyvinyl alcohol in aqueous solution increases, the resultant contrast enhancement coating gets thicker. For a coating thickness of about 1500 Angstroms, the concentration of total solids in solution should be about ten percent. It has been experimentally determined that a 4.7% photoreactive compound/4.7% polyvinyl alcohol concentration by weight in aqueous solution performs the best.

In order to preserve coating properties, there should not be more than a 2:1 concentration of photosensitive compound to binder. In order to exhibit the required photosensitivity, there should be at least one-third part photosensitive compound to every part of binder in the aqueous solution. When the solution is coated onto photoresist layer 20 and dried, the resultant contrast enhancement layer 38 will consist essentially of from 25% to 67% by weight of the sulfonamide chloride and the remainder polyvinyl alcohol.

One advantage of the composition of the invention is that it has a shelf life superior to the conventional contrast enhancement composition. The conventional composition has a shelf life of about three months. It is suspected that the conventional composition comprises a diazonium salt, which decays spontaneously at room temperature. This would account for its poor shelf life. On the other hand, the composition of the invention has a shelf life of about one year, which is the same as the shelf life of conventional photoresists.

In summary, a water-soluble contrast enhancement compound, composition and method of use has been disclosed. The compound of the invention has the advantage over the prior art of being water soluble, whereby an organic solvent for the deposit and removal of the same is no longer required. Further, the integrity of the underlying photoresist layer is better preserved, as conventional photoresist layers are not soluble in a pH-neutral aqueous medium.

While preferred embodiments of the invention have been shown and described in the above specification and drawings, it should be understood that the invention is not limited to the disclosed embodiments, but is capable of numerous rearrangements, modifications, and substitutions of parts and elements without departing from the spirit and scope of the invention as defined by the appended claims.

What is claimed is:

1. A photosensitive contrast enhancement composition for application on a photoresist layer during a semiconductor chip manufacturing process, said composition consisting essentially of an aqueous solution from about 25% to 67% by weight of a 1-oxy-2-diazonaphthalene sulfonamide salt and a binder in sufficient quantity for good coating properties;

wherein said sulfonamide salt consists essentially of a compound having the formula:

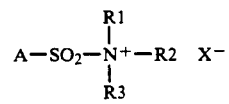

wherein "A" represents a 1-oxy-2-diazonaphthalene radical, and R1, R2, and R3 represent radicals selected from the group consisting of hydrogen, methyl, ethyl, propyl and butyl, and X is a water-solubilizing anion.

2. The composition of claim 1, wherein R1, R2 and R3 represent radicals selected from the group consisting of methyl, ethyl, propyl and butyl.

3. A photosensitive contrast enhancement composition for coating a photoresist layer in a semiconductor chip manufacturing process, comprising in aqueous solution:

from about 1.67% to about 16.6% by weight of a 1-oxy-2-diazonaphthalene sulfonamide salt wherein said sulfonamide salt has the formula:

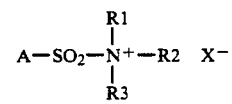

wherein "A" represents a 1-oxy-2-diazonaphthalene radical, R1, R2 and R3 represent alkyl groups ranging in carbon atom number from $C_1$ to $C_4$ and which may be the same or different from each other, and X is a water-solubilizing anion; and from about 4.3% to about 8.8% by weight of a binder, the weight ratio of said sulfonamide salt to said binder ranging from about 1/3:1 to about 2:1.

4. The composition of claim 3, wherein R1, R2 and R3 represent ethyl.

5. The composition of claim 3, wherein X represents halide.

6. The composition of claim 5, wherein X represents chloride.

7. The composition of claim 3, wherein said sulfonamide salt is dissolved in an aqueous solution in a concentration of approximately 4.7% by weight.

8. The composition of claim 3, wherein said binder is present in a concentration of about 4.7% by weight.

9. The composition of claim 3, wherein said binder comprises polyvinyl alcohol.

* * * * *